United States Patent
Goh et al.

(10) Patent No.: US 8,466,997 B2
(45) Date of Patent: Jun. 18, 2013

(54) FAN-OUT WAFER LEVEL PACKAGE FOR AN OPTICAL SENSOR AND METHOD OF MANUFACTURE THEREOF

(75) Inventors: Kim-Yong Goh, Singapore (SG); Jing-En Luan, Singapore (SG)

(73) Assignee: STMicroelectronics PTE Ltd., Singapore (SG)

( * ) Notice: Subject to any disclaimer, the term of this patent is extended or adjusted under 35 U.S.C. 154(b) by 473 days.

(21) Appl. No.: 12/651,304

(22) Filed: Dec. 31, 2009

(65) Prior Publication Data

US 2011/0157452 A1 Jun. 30, 2011

(51) Int. Cl.
*H04N 5/225* (2006.01)
*H05K 7/00* (2006.01)
*H01L 23/06* (2006.01)

(52) U.S. Cl.
USPC .......................... 348/340; 361/783; 257/684

(58) Field of Classification Search
USPC ... 348/340; 361/760, 767, 783; 257/618–626, 257/684, 693, 700–701
See application file for complete search history.

(56) References Cited

U.S. PATENT DOCUMENTS

| | | | |
|---|---|---|---|
| 4,603,374 A | 7/1986 | Wasielewski | |
| 4,715,115 A | 12/1987 | King et al. | |
| 5,222,014 A | 6/1993 | Lin | |
| 5,309,011 A | 5/1994 | Tazunoki et al. | |
| 5,355,580 A | 10/1994 | Tsukada | |
| 5,488,200 A | 1/1996 | Tsukada | |
| 5,936,843 A | 8/1999 | Ohshima et al. | |
| 6,253,992 B1 | 7/2001 | Fjelstad | |
| 6,271,469 B1 | 8/2001 | Ma et al. | |
| 6,344,682 B1 | 2/2002 | Tomita | |
| 6,350,668 B1 | 2/2002 | Chakravorty | |
| 6,680,529 B2 | 1/2004 | Chen et al. | |
| 6,717,245 B1 | 4/2004 | Kinsman et al. | |
| 6,828,665 B2 | 12/2004 | Pu et al. | |
| 6,882,054 B2 | 4/2005 | Jobetto | |
| 6,940,169 B2 | 9/2005 | Jin et al. | |
| 7,045,899 B2 | 5/2006 | Yamane et al. | |

(Continued)

OTHER PUBLICATIONS

Kim-Yong Goh, "Multi-Stacked Semiconductor Dice Scale Package Structure and Method of Manufacturing Same," U.S. Appl. No. 12/651,080, filed Dec. 31, 2009, 38 pages.

(Continued)

*Primary Examiner* — Kelly L Jerabek
(74) *Attorney, Agent, or Firm* — Seed IP Law Group PLLC (57) ABSTRACT

An optical sensor package has a transparent substrate with a redistribution layer formed on a face thereof, which includes a window and a plurality of electrically conductive traces. A semiconductor substrate, including an optical sensor and a plurality of contact terminals on a face thereof, is positioned on the transparent substrate in a face-to-face arrangement, with the optical sensor directly opposite the window, and with each of the contact terminals electrically coupled to a respective one of the electrically conductive terminals. The transparent substrate has larger overall dimensions than the semiconductor substrate, so that one or more edges of the transparent substrate extend beyond the corresponding edges of the semiconductor substrate. A plurality of solder balls are positioned on the face of the transparent substrate, each in electrical contact with a respective one of the electrically conductive terminals. The solder balls and the semiconductor substrate are at least partially encapsulated in an encapsulating layer formed on the face of the transparent substrate, which has been planarized to expose upper portions of the solder balls, as contact pads of the optical sensor package.

13 Claims, 5 Drawing Sheets

U.S. PATENT DOCUMENTS

| | | | |
|---|---|---|---|
| 7,067,911 B1 | 6/2006 | Lin et al. |
| 7,141,873 B2 | 11/2006 | Aoyagi |
| 7,193,301 B2 | 3/2007 | Yamaguchi |
| 7,489,032 B2 | 2/2009 | Jobetto |
| 7,714,453 B2 | 5/2010 | Khan et al. |
| 7,772,687 B2 | 8/2010 | Inoue |
| 7,871,861 B2 | 1/2011 | Song et al. |
| 7,989,707 B2 | 8/2011 | Yamano et al. |
| 8,003,496 B2 | 8/2011 | Oh et al. |
| 8,004,092 B2 | 8/2011 | Lin et al. |
| 8,106,495 B2 | 1/2012 | Kajiki |
| 8,125,066 B1 | 2/2012 | Kang |
| 8,158,888 B2 | 4/2012 | Shen et al. |
| 2002/0070443 A1 | 6/2002 | Mu et al. |
| 2004/0033643 A1 | 2/2004 | Odegard et al. |
| 2004/0075164 A1 | 4/2004 | Pu et al. |
| 2005/0041134 A1* | 2/2005 | Takayama | 348/340 |
| 2005/0121764 A1 | 6/2005 | Mallik et al. |
| 2005/0146051 A1 | 7/2005 | Jobetto |
| 2005/0161823 A1 | 7/2005 | Jobetto et al. |
| 2006/0091521 A1 | 5/2006 | Cady et al. |
| 2006/0256222 A1* | 11/2006 | Tsai | 348/308 |
| 2007/0090508 A1 | 4/2007 | Lin et al. |
| 2007/0181989 A1 | 8/2007 | Corisis et al. |
| 2008/0017968 A1 | 1/2008 | Choi et al. |
| 2008/0083988 A1 | 4/2008 | Lin |
| 2008/0157329 A1 | 7/2008 | Inoue |
| 2009/0057895 A1 | 3/2009 | Lin et al. |
| 2009/0127688 A1 | 5/2009 | Lee et al. |
| 2009/0212412 A1 | 8/2009 | Yoon |
| 2009/0322437 A1 | 12/2009 | Avni et al. |
| 2010/0072600 A1 | 3/2010 | Gerber |
| 2010/0090323 A1 | 4/2010 | Shinoda et al. |
| 2010/0117212 A1 | 5/2010 | Corisis et al. |
| 2010/0148316 A1 | 6/2010 | Kim et al. |
| 2010/0244263 A1 | 9/2010 | Lin et al. |
| 2011/0024905 A1 | 2/2011 | Lin et al. |
| 2011/0032400 A1* | 2/2011 | Yang | 348/294 |
| 2011/0156230 A1 | 6/2011 | Goh |
| 2011/0156240 A1 | 6/2011 | Luan et al. |
| 2011/0156250 A1 | 6/2011 | Goh et al. |
| 2011/0157452 A1 | 6/2011 | Goh et al. |
| 2011/0157853 A1 | 6/2011 | Goh |
| 2011/0260303 A1 | 10/2011 | Pagaila et al. |
| 2011/0278717 A1 | 11/2011 | Pagaila et al. |
| 2011/0291274 A1 | 12/2011 | Meyer et al. |
| 2011/0316146 A1 | 12/2011 | Pagaila et al. |
| 2011/0316156 A1 | 12/2011 | Pagaila et al. |
| 2012/0049364 A1 | 3/2012 | Sutardja et al. |

OTHER PUBLICATIONS

Kim-Yong Goh et al, "Flip-Chip Fan-Out Wafer Level Package for Package-on-Package Applications, and Method of Manufacture," U.S. Appl. No. 12/651,365, filed Dec. 31, 2009, 20 pages.

Jing-En Luan et al, "Reliable Large Die Fan-Out Wafer Level Package and Method of Manufacture," U.S. Appl. No. 12/651,362, filed Dec. 31, 2009, 27 pages.

Kim-Yong Goh, "Fan-Out Wafer Level Package With Polymeric Layer for High Reliability" U.S. Appl. No. 12/651,295, filed Dec. 31, 2009, 31 pages.

Johnson, "STATS ChipPAC Expands eWLB to Reconstituted 300 mm Wafers," *Semiconductor International*, published Apr. 15, 2010, downloaded from http://english.ime.cas.cn/ns/es/201004/t20100429_53569.html, which was published by Microelectronice of Chinese Academy of Sciences, 2007, 2 pages.

Goh, "Fan-Out Wafer Level Package With Polymeric Layer for High Reliability," U.S. Appl. No. 12/649,130, filed Dec. 29, 2009, 30 pages.

Chua et al., "Method for Producing VIAS in Fan-Out Wafers Using Dry Film and Conductive Paste, and a Corresponding Semiconductor Package," U.S. Appl. No. 12/977,697, filed Dec. 23, 2010, 34 pages.

Jin, "Apparatus and Method for Placing Solder Balls," U.S. Appl. No. 13/340,275, filed Dec. 29, 2011, 31 pages.

ASE Tech Forum, "ASE PoP (TRD PoP & MAP PoP)," The Advanced Semiconductor Engineering Group, Sep. 2007, 37 pages.

* cited by examiner

FAN-OUT WAFER LEVEL PACKAGE FOR AN OPTICAL SENSOR AND METHOD OF MANUFACTURE THEREOF

BACKGROUND OF THE INVENTION

1. Technical Field

Embodiments of the present invention are directed to a wafer-level package for an optical sensor device, and in particular, to a package using flip-chip solder bumps to couple the optical sensor to a fan-out redistribution layer on an optically transparent substrate.

2. Description of the Related Art

An optical sensor is the central and fundamental element of a digital camera. The optical sensor captures an image and converts it to electronic data that is transmitted to other circuits of the camera for processing, display, storage, transmission to other devices, etc.

Figure 1:
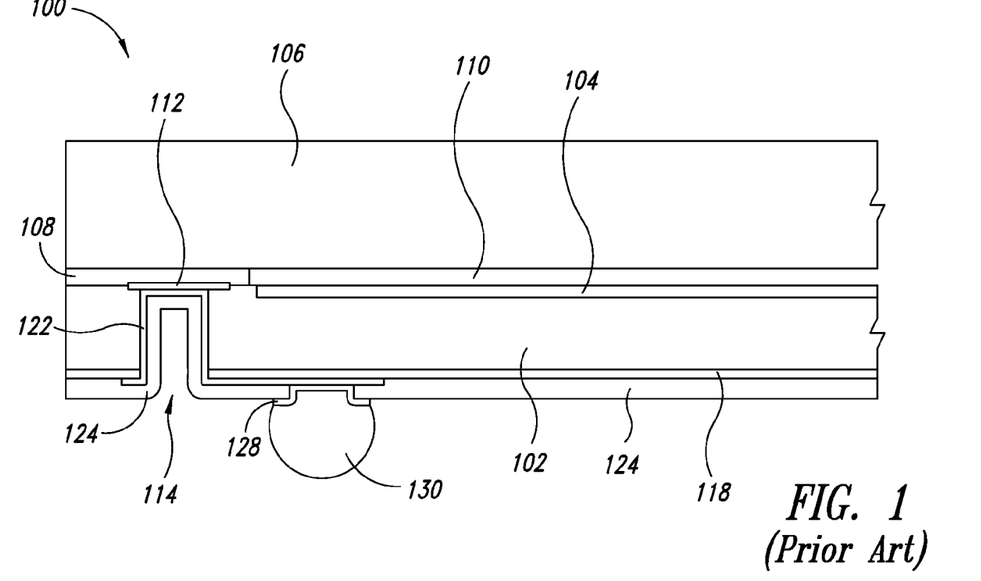
FIG. 1 shows a side cross-sectional view of a portion of a prior art optical sensor package, taken at lines 1-1 of FIG. 2.

FIG. 1 shows a side cross-sectional view of a portion of a prior art optical sensor package 100. The optical sensor package 100 includes a semiconductor material substrate 102 on which is formed the optical sensor itself. A glass cover 106 is coupled to an upper surface of the semiconductor substrate 102 by an adhesive layer 108, with a small air cavity 110 between the glass layer and the optical sensor 104. Devices that are formed on semiconductor material substrates are generally formed on only one surface thereof, and actually occupy a very small part of the total thickness of the substrate. Typically, after the formation of an electronic device on a substrate, additional passivating and insulating layers are deposited over the device, and contact terminals of the device are formed over the insulating layers. In the case of the optical sensor device of FIG. 1, because the optical sensor 104 must remain exposed to receive optical images, contact terminals 112 are formed around the perimeter of the optical sensor 104. In order to access the image data from the optical sensor 104, a camera or other device must have a connection to the contact terminals 112.

A challenge that designers face with respect to coupling the optical sensor 104 to a camera circuit is that the device must be positioned with the optical sensor facing outward, and without any obstructions that would interfere with the reception of an optical image. This makes it difficult to couple a circuit to contact pads 112 that are on a side facing away from the printed circuit board, without the benefit of more traditional packaging techniques, which are not compatible with the correct operation of the optical sensor.

FIG. 1 shows one of a plurality of through-silicon-vias (TSV) 114 that is formed in the substrate 102, and by which electrical contact is made with contact pads 112 on the opposite face of the substrate 102. Each TSV includes an aperture 116 that is etched from the backside of the substrate 102 and extends to a respective contact pad 112 on the front. Following the formation of the apertures 116, a conductive layer 120 is deposited on the back surface of the substrate 102 and inside the aperture 116, forming an electrical contact between the conductive layer 120 and the contact pad 112. The conductive layer 120 is then etched to form electrical traces 122 extending from the contact pads 112 to the back surface of the substrate 102. A passivation layer 124 is then formed over the back surface of the substrate 102, covering the electrical traces 122. The passivation layer 124 is masked and etched to form an aperture 126, which exposes one end of the electrical trace 122. Another conductive layer is deposited and etched to form a contact pad 128 over the passivation layer 124, which is in electrical contact with the electrical trace 122. Finally, a solder ball is formed on the contact pad 128.

The TSV structure, including the solder ball 130, is one of a very large plurality of such structures that are distributed around the perimeter of the optical sensor 104. To couple the optical sensor package 100 to an electronic circuit, the package 100 is positioned on a printed circuit board, with each of the solder balls 130 in physical contact with a corresponding contact pad of the circuit board. The package 100 and circuit board are then heated to a temperature sufficient to melt the solder balls, which reflow and form mechanical and electrical connections between the optical sensor package 100 and the electrical circuit of the printed circuit board.

Figure 2:
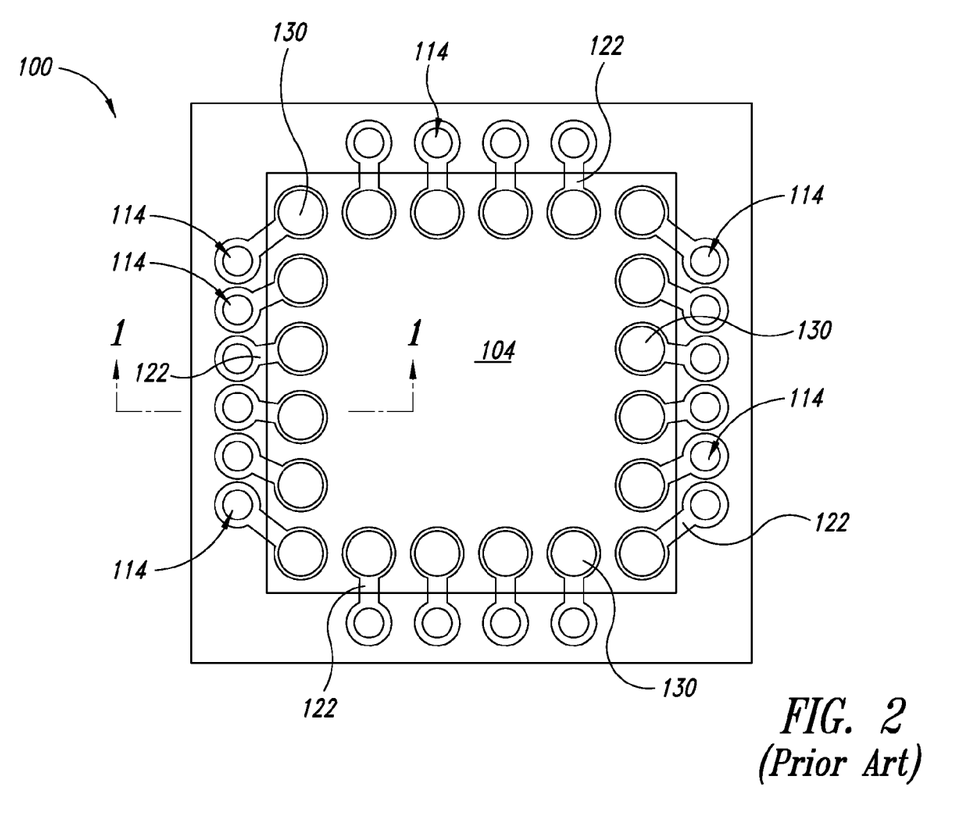
FIG. 2 shows a simplified diagrammatic plan view of the prior art optical sensor package of FIG. 1.

FIG. 2 shows a simplified diagrammatic plan view of the optical sensor package 100, showing the position of the optical sensor 104 in relation to the TSV structures 114, the electrical traces 122 and the solder balls 130, although the arrangement shown is merely exemplary. In practice, the distribution of the TSVs 114 and the solder balls 130 may be less regular, and there may be many more than are shown here.

There are a number of problems associated with optical sensor packages of the type described with reference to FIGS. 1 and 2. First, the use of TSV structures around the perimeter of the optical sensor 104 can increase the necessary size of the semiconductor substrate, relative to the dimensions of the optical sensor, because a TSV requires more space than would be necessary for a conventional contact pad, for example. This reduces the number of chips that can be formed on a semiconductor wafer, which in turn increases the cost, per unit. Second, the apertures of the TSV structures can potentially weaken the substrate. In the case where a large number of apertures are positioned in a row, the substrate is more susceptible to cracking along that line of apertures. Third, the locations of the solder balls 112 directly opposite the optical sensor 104 create points where the device is rigidly supported from below, while it is largely unsupported elsewhere. This can present problems even before the device is sold to a customer. After a device is manufactured and before it is shipped, the device undergoes testing, during which it is placed in a fixture with contact points in positions corresponding to the solder balls 112. Unless it is handled with extreme care during the testing procedure, the device can be damaged. For example, if excessive or uneven pressure is applied to the upper surface of the glass cover as it is being placed in the fixture, the concentration of forces at the solder balls can cause fractures in electrical traces or dielectric layers, which can result in immediate failure of the device, during the final parametric tests, or can produce a delayed failure, which may occur after the device has been integrated into a camera and sold. Additionally, pressure on the upper surface of the glass cover 106, which is transferred to the substrate 102 around the perimeter of the device, can cause the outer portion of the substrate 102 to flex downward, and the central portion of the substrate to flex upward, resulting in bending of the membrane of the optical sensor, and a loss of parallelism between the surface of the optical sensor and the inner surface of the glass cover in the air cavity 110 (these surfaces should be precisely parallel). This results in interference lines appearing in images captured by the sensor 104. This can also occur if a bracket or piece of trim in the camera applies pressure to the edge of the device. Finally, some optical sensor devices have shown a tendency to transmit light from behind the device, via the TSV structure, which can degrade the quality of a captured image.

BRIEF SUMMARY

According to one embodiment, an optical sensor package is provided, having an optically transparent substrate with an electrical redistribution layer formed on a face thereof. A semiconductor substrate, including an optical sensor and a plurality of contact terminals on a face thereof, is positioned on the transparent substrate in a face-to-face arrangement. The optical sensor directly opposite a window that is open in the transparent layer, and with each of the contact terminals electrically coupled to a respective electrically conductive trace of the redistribution layer on the transparent substrate. The transparent substrate has larger overall dimensions than the semiconductor substrate, and serves, with the redistribution layer, as a fan-out structure for the semiconductor substrate. A plurality of contacts, such as solder balls, are positioned on the face of the transparent substrate, with each in electrical contact, via the redistribution layer, with a respective one of the contact terminals of the semiconductor substrate. The solder balls and the semiconductor substrate are at least partially encapsulated in a layer of molding compound positioned on the face of the transparent substrate. The layer of molding compound has been ground back to expose upper portions of the solder balls, which serve as contact pads of the optical sensor package.

A method is also provided for manufacturing the optical sensor package.

A plurality of conductive traces are formed on a surface of the transparent substrate. Landing pads are formed on the transparent substrate. A solder paste is applied to the landing pads. A semiconductor die having an optical sensor and solder balls on a front face thereof is brought into electrical contact with the landing pads. The solder is reflowed to electrically couple the semiconductor die to the transparent layer and form an optical sensor.

DETAILED DESCRIPTION

Figure 3:
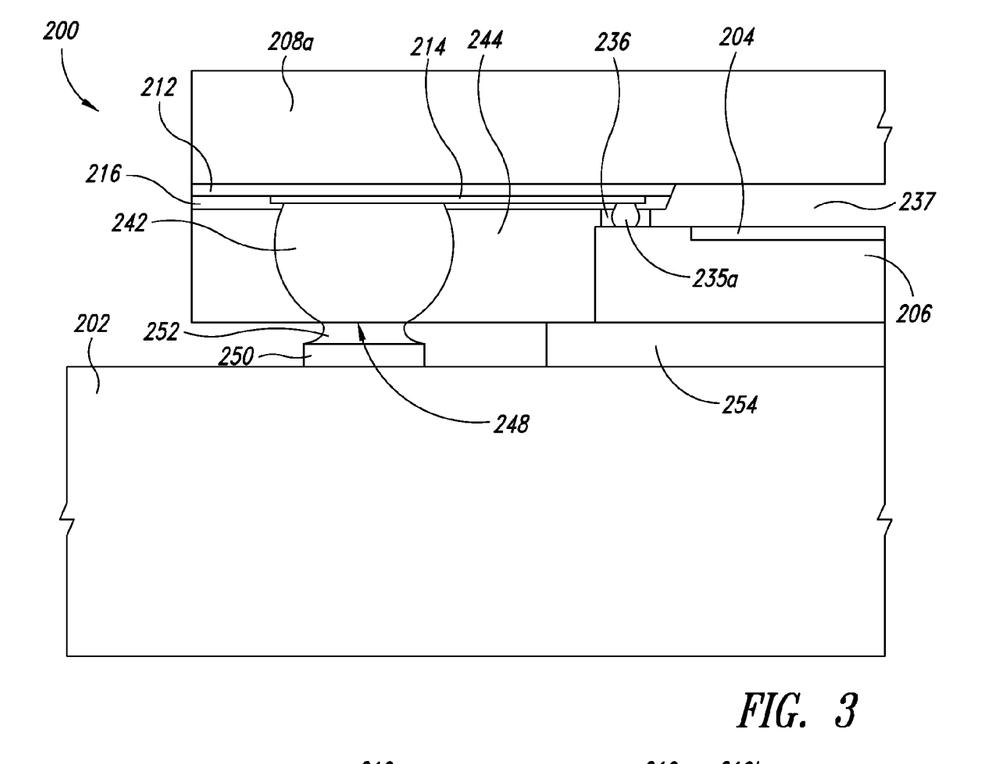
FIG. 3 shows a diagrammatic cross-sectional view of an optical sensor package according to an embodiment of the invention, coupled to a circuit board of a camera.

According to an embodiment of the invention, an optical sensor package is 200 is provided, as shown in FIG. 3. The package 200 is positioned on a printed circuit board 202, and includes an optical sensor 204 positioned on a face of a semiconductor die 206, with transparent plate 208a positioned over the optical sensor 204. A dielectric layer 212 is formed on the transparent plate 208a, over which a conductor 214 and another dielectric layer 216 is formed. The semiconductor die 206 is electrically coupled by solder contacts 235a to the conductive layer 214. A solder ball 242 is electrically coupled to the conductive layer 214, and also to a contact pad 250 of the circuit board 202, via a solder connection 252, thereby providing electrical continuity from the optical sensor 204 to the circuit board 202. An adhesive material 254 mechanically supports the package 200, and in particular, the die 206, and also provides thermal transmission to sink heat from the die 206 to the circuit board 202.

The transparent plate 208 can be any material that is acceptable. It may be optically clear glass, a hard plastic, a soda-lime glass, a glass lens, or any material that has qualities of light transmission and clarity that are acceptable for a given application. Where the package 200 is to be used as a photographic sensor in a camera, the transparent plate 208 is preferably a material that transmits visible light without perceptible distortion or attenuation.

The manufacturing process and associated structures of the optical sensor package 200 will now be described with reference to FIGS. 3-13.

Figures 4, 5:
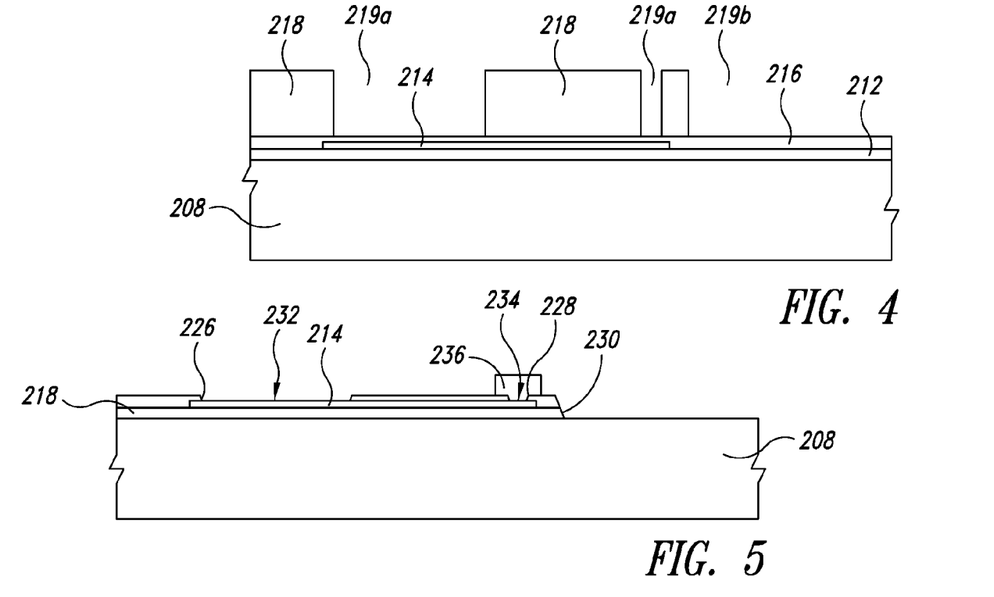
FIGS. 4-13 show the optical sensor package of FIG. 3, or precursor components thereof, at various stages of manufacture, with FIGS. 4, 5, 7, 8, and 10-13 being diagrammatic cross-sectional views, FIG. 6 being a partial plan view, and FIG. 9 being a simplified perspective view.

Preparation of the transparent plate 208a will now be described. A transparent wafer 208 having locations for a plurality of transparent plates 208a is prepared to receive a plurality of semiconductor material dice as will now be described with reference to FIGS. 4-6. A dielectric layer 212 is first formed on an upper surface of the transparent wafer 208. A conductive layer 214 is then formed on the dielectric layer 212, patterned, and etched to form electrical traces 214. A second dielectric layer 216 is then formed over the traces 214 and the dielectric layer 212. FIG. 4 shows an etching mask 218 positioned over the second dielectric layer 216. Where openings 219 in the mask are positioned over features of the conductive layer 214, as shown at openings 219a, the second dielectric layer 216 will be etched, but the material of the conductive layer will act as an etch stop, preventing further penetration of the etch. Where, on the other hand, there is no conductive material, as at opening 219b, the etch process will remove the material of both the first and the second dielectric layers 212, 216, leaving the transparent wafer exposed.

As shown in FIG. 5, the first and second dielectric layers 212, 216, are etched with the mask 218 in place to produce respective pluralities of first and second contact apertures 226, 228, and a plurality of optical sensor windows 230. The first contact apertures 226 are positioned over the electrical traces 214 so that a respective first contact pad 232 is exposed at a first end of each of the electrical traces 214. The second contact apertures 228 are positioned to expose a respective second contact pad 234 at a second end of each of the electrical traces 214. The dielectric material is completely removed at the optical sensor windows 230 so that the surface of the transparent wafer is exposed. A layer of sealing material 236 is selectively deposited over the second dielectric layer 216 so as to cover the second contact pads 234 and completely enclose a perimeter of the window 230.

Figure 6:
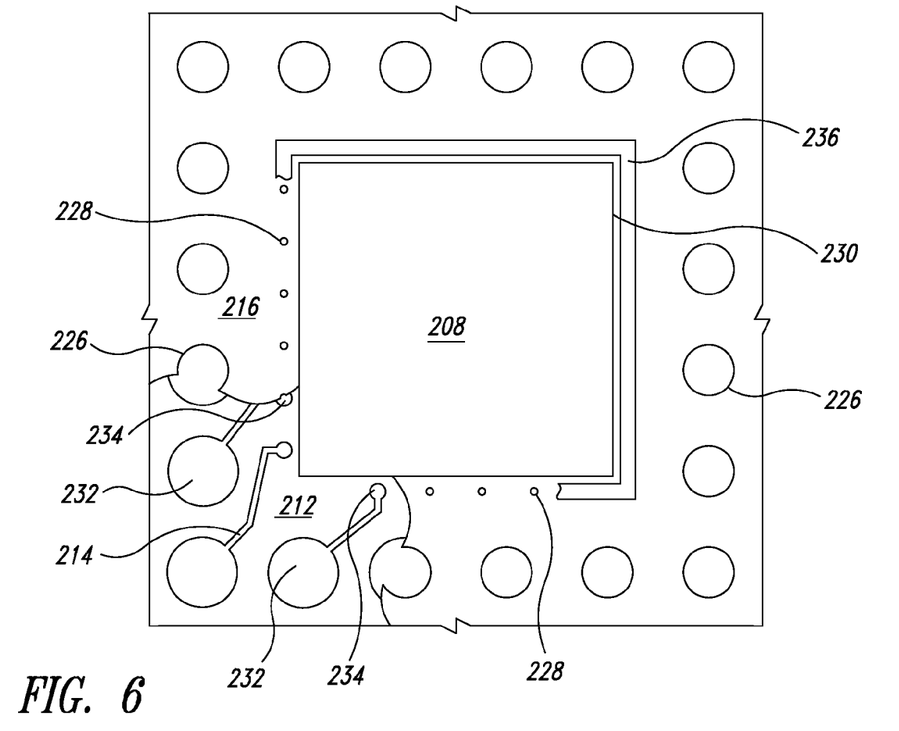

FIG. 6 is a diagrammatic plan view of a portion of the transparent wafer 208, showing the arrangement of the first contact apertures 226 and second contact apertures 228 around one of the plurality of windows 230. Portions of the second dielectric layer 216 and the layer of sealing material 236 are cut away to show the relative positions of the layer of sealing material 236, the first contact pads 232, the second contact pads 234, the first contact apertures 226, the second contact apertures 228, and the electrical traces 214. The surface of the transparent wafer 208 is exposed inside the window 230.

The layer of sealing material 236 can be configured to serve as a flux for a later solder step. However, its primary purpose is to seal around the perimeter of the window 230, so even if, in a given application, the second contact pads 234 are not distributed around the entire window, or are not positioned close to the window, the layer of sealing material is deposited to fully enclose the window.

Figure 7:
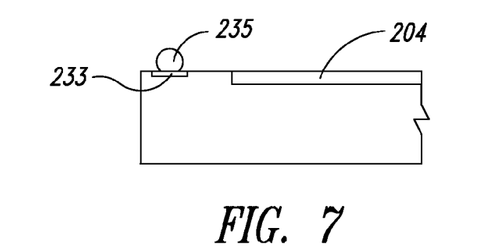

Turning now to FIG. 7, the semiconductor die 206 is shown, which has been processed separately. The die 206 is one of a plurality of dice formed as part of a semiconductor material wafer, and includes the optical sensor 204 and a plurality of contact pads 233, each with a respective one of a plurality of flip chip type solder ball contacts 235 on an active face thereof, formed in a manner well known in the art.

Figure 8:
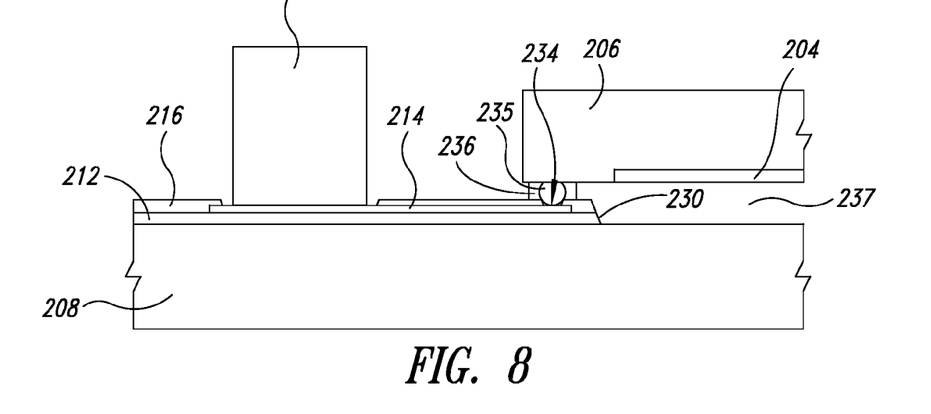

As shown in FIG. 8, the semiconductor material die 206 is positioned with the active face facing the transparent wafer 208, with the optical sensor 204 positioned over the window 230 and the flip chip solder ball contacts 235 aligned with respective ones of the second contact pads 234. The die 206 is pressed against the wafer 208 so that the contacts 235 penetrate through the layer of sealing material 236 until they contact respective ones of the second contact pads 234 and the face of the die contacts the sealing material, as shown in FIG. 8. A preselected amount of solder paste 238 is deposited over each of the plurality of first contact pads 232.

For illustration purposes, the dielectric layers 212, 216 and conductive layer 214 are shown in the drawings as having a substantial thickness. In practice, however, their thickness may be negligible. Accordingly, the height of the solder balls 235 contacting the second contact pads 234 establishes the vertical space of an air cavity 237 between the respective faces of the optical sensor 204 and the transparent wafer 208.

Turning to FIGS. 9-11b, the transparent wafer 208 is then heated to a temperature sufficient to melt and reflow the solder paste 238 and the solder ball contacts 235, resulting in the formation of large solder balls 242 on each of the first contact pads 232, solder joints 235a coupling the contact pads of the semiconductor devices 240 to respective ones of the second contact pads 234.

Figure 9:
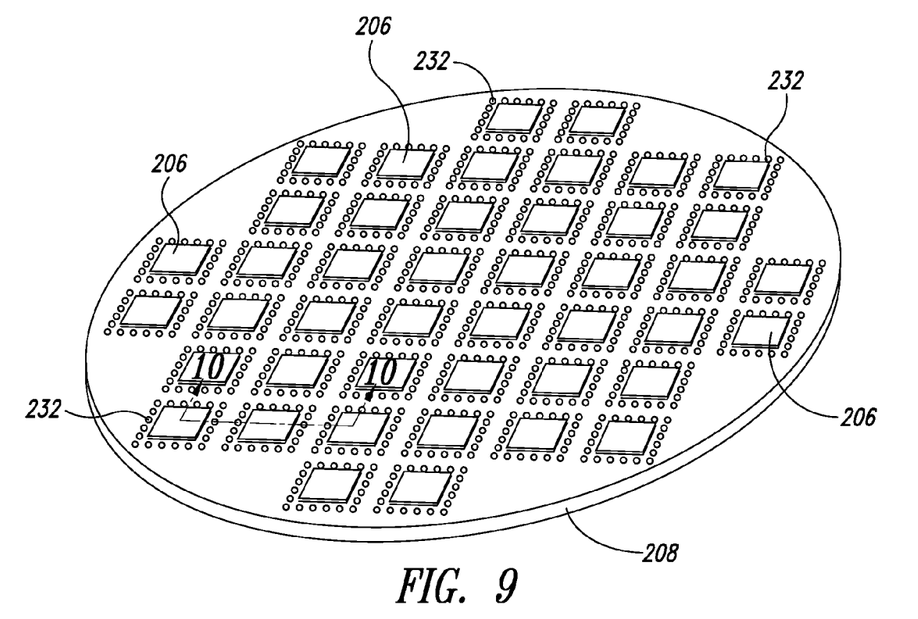
Figure 10:
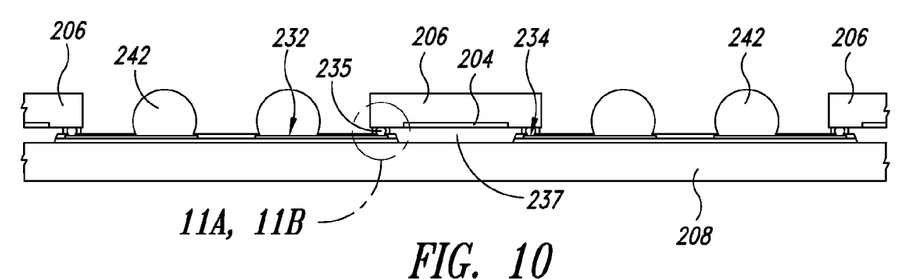

FIG. 9 shows the transparent wafer 208 with a plurality of dice 206 positioned over respective windows, and the large solder balls 242. FIG. 10 shows a portion of the transparent wafer 208 in cross section taken along lines 10-10 of FIG. 9, with dice 206 and solder balls 242 positioned thereon. Horizontal dimensions of FIG. 10 are reduced, as compared to other figures, to show the arrangement of several dice and solder balls on the wafer.

Figure 11A:
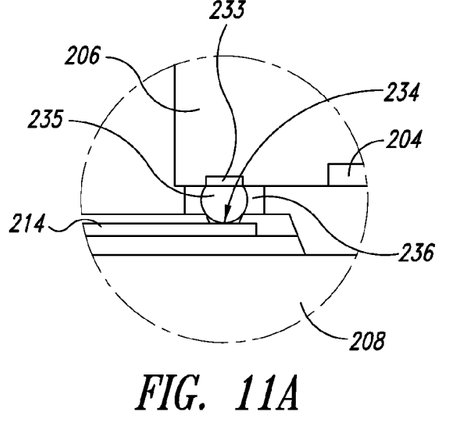
Figure 11B:
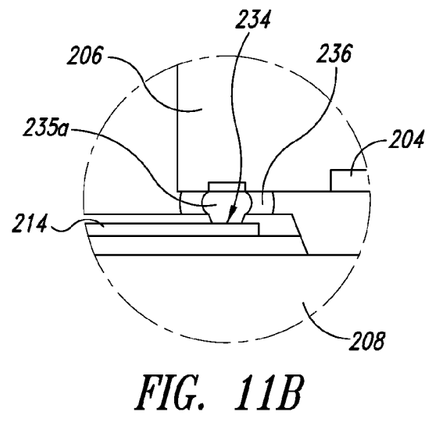

FIGS. 11A and 11B are details taken from a position shown in FIG. 10 at 11, showing one solder ball contact 235, before and after the reflow process. FIG. 11A shows the contact 235 before reflow, in the shape of a ball, and resting against the second contact pad 234. FIG. 11B shows the contact 235a after reflow, in the form of a solder joint, or connection, between the contact pad 233 of the die 206 and the second contact pad 234.

During the solder reflow process, a portion of the layer of sealing material 236 serves as a flux, to ensure a secure and clean bond of the solder of the solder contact 235 with the second contact pads 234. The remaining sealing material 236 is cured by the heat, forming a seal between the perimeter of the optical sensors 204 and the surface of the transparent wafer 208, as shown in FIG. 11B. If the sealing material 236 is still sufficiently pliable when the solder contacts 235 liquefy during the reflow step, the action of surface tension on the liquid solder may control the spacing between the optical sensor 204 and the transparent wafer 208. Parallelism of the optical sensor 204 and transparent wafer 208 is maintained by keeping the volume of solder in each solder ball substantially equal. Alternatively, the sealing material 236 may be partially cured before the reflow step, in order to fix the spacing in the air cavity 237 and ensure the two structures 204 and 208 are properly spaced and parallel.

Figure 12:
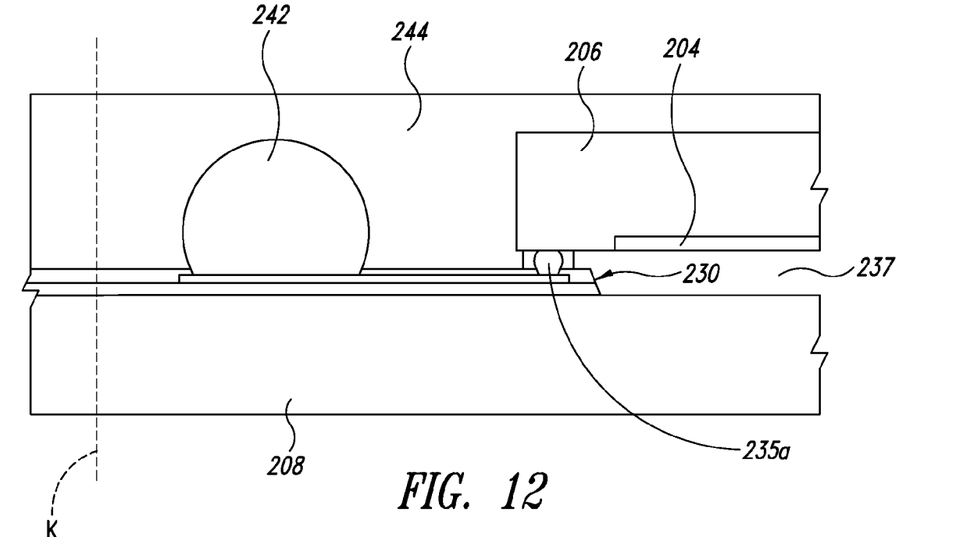

As shown in FIG. 12, a quantity of molding compound 244 is next deposited on the upper surface of the wafer 208, and subjected to a compression molding step, during which the compound is cured and hardened. The dice 206 and the solder contacts 235a are encapsulated by the molding compound, but, because of the layer of sealing material 236, the molding compound is prevented from going under the dice 206 and onto the windows 230. The sealing material 236 serves as a seal to block any impurities from going into the cavity 237 between the optical sensor 204 and the transparent wafer 208.

Figure 13:
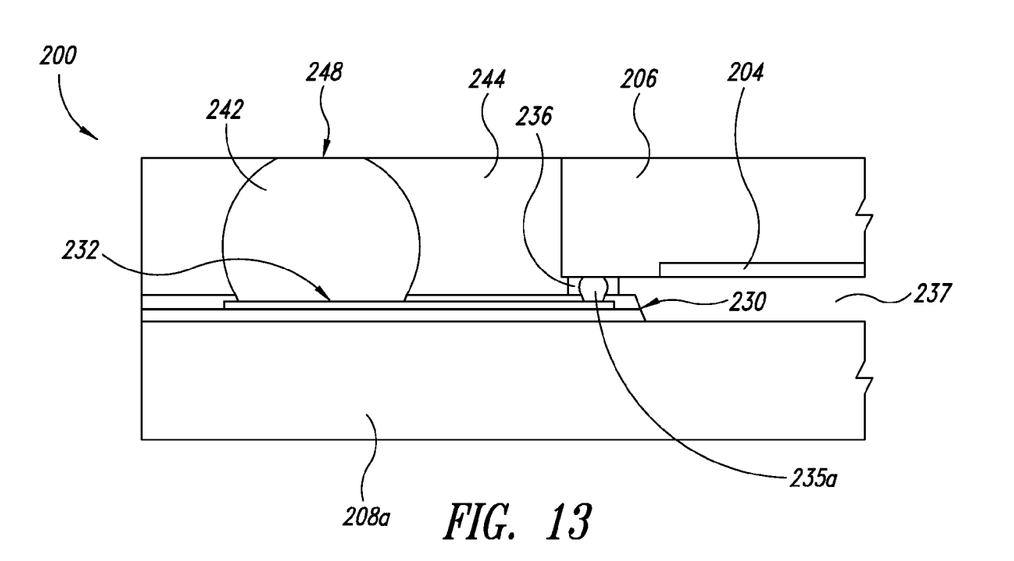

Turning now to FIG. 13, after the molding compound 244 is cured, a back grind of the wafer 208 is executed to remove a portion of the molding compound 244, and possibly a small portion of the die 206. Additionally, a top portion of each of the solder balls 242 is removed by the backgrind, exposing the metal of the solder balls to serve as contact pads 248. As indicated by kerf lines K in FIG. 12, the wafer is then cut into individual optical sensor packages 200, each comprising a semiconductor material die 206 with an optical sensor 204, and a transparent plate 208a.

After completion of the optical sensor package, and before installation on a circuit board, the package is tested. During the testing process, the package 200 is placed in a testing fixture that makes electrical contact with each of the contact pads 248 to test the function of the optical sensor 204. In contrast to the arrangement described above with reference to the prior art device of FIGS. 1 and 2, the solder balls 242 are well supported by the molding compound 244 in which they are substantially encapsulated, and which shares and distributes the physical load, so conductor and insulator layers behind the solder balls are much less susceptible to damage from mishandling. Additionally, pressure is transmitted from the solder balls 242 to the transparent plate 208a—or viceversa—without affecting the sensor 204, or even the die 206. Thus, for example, if pressure is applied to the transparent plate 208a while in the testing fixture, the die 206 is unaffected and unharmed.

Returning to FIG. 3, the optical sensor package 200 is shown installed on the circuit board 202 of a camera. During installation, the package 200 is inverted, with respect to the orientation shown in FIGS. 4-13, so that the transparent plate 208a is positioned above the die, while the semiconductor material die 206 is again face up. The package 200 is positioned over the circuit board 202 so that the each of the contact pads 248 is in contact with a corresponding contact pad 250 of the circuit board, which has preferably been pre-tinned, or provided with a small amount of solder 252. A final reflow step is executed to join the contact pads 248 of the optical sensor package 200 to the contact pads 250 of the circuit board 202. An adhesive 254 is positioned on the circuit board in a location that corresponds to the semiconductor material die 206, and serves to physically support the package 200 after installation. The adhesive is selected to be thermally conductive, so that it can transmit heat from the die 206 to the circuit board 202. As one alternative to the adhesive 254, a thermally conductive grease can be applied to act as a heat sink.

According to the embodiment disclosed above, the back grind exposes the back side of the die 206. Alternatively, the height of the solder balls 242 can be increased and the amount of the back grind reduced so that the die 206 remains fully encapsulated within the molding compound, while the solder balls 242 extend to the face of the molding compound layer 244 to provide electrical contact at pads 248.

As discussed above, the layer of sealing material 236 serves to seal the air cavity 237 around the optical sensor 204, and prevent the molding compound 244, while in a liquid state, from entering the air cavity. Alternatively, the spacing between the die and the transparent wafer, the viscosity of the molding compound 244, and the pressure applied during the compression molding step are selected to prevent the molding compound from penetrating into the space between the die 206 and the wafer 208 more than a selected distance, thereby obviating the requirement for a seal. Other sealing structures can also be provided. The sealing material can be any suitable material. According to an embodiment, a no-flow underfill material is used as a sealing material.

First and second dielectric layers 212, 216 and conductive layer 214 are disclosed as providing redistribution of the signal paths from the semiconductor material substrate 206 to the solder balls 242, and can be referred to, collectively, as a redistribution layer. Any of the individual layers can themselves comprise multiple layers. For example, the dielectric layers can include one or more passivation layers, buffer layers, spacing layers, etc., and the conductive layer can include one or more interconnect layers, metal layers, seed layers, undermetal layers, plated metallic layers, vapor deposited layers, barrier layers, etc. Additionally, the redistribution layer can comprise greater or fewer layers than disclosed in the embodiment of FIGS. 3-12. For example, the first dielectric layer 212 can, according to an embodiment, be omitted entirely, and the conductive layer 214 can be deposited on the surface of the transparent wafer 208. According to another embodiment, an additional conductive layer is positioned over the second dielectric layer 216, and substantially covered by a third dielectric layer, to accommodate a more complex interconnection circuit and to connect some of the solder contacts 235a to each other.

According to an embodiment, one or more of the first and second dielectric layers 212, 216, the molding compound 244, and the underfill material 236 are formulated to be substantially opaque to selected wavelengths of light, in order to prevent passage of undesired light.

The embodiment described above with reference to FIGS. 3-13 employs a first plurality of solder ball contacts to electrically couple the optical sensor to the redistribution layer on a transparent plate to form a complete optical sensor package, and a second plurality of solder balls to electrically couple the optical sensor package to the circuit board. However, other contact structures can also be used in place of either or both pluralities, including, for example, metallic columns, plastic bumps, anisotropic conductors, etc.

Many optical sensors are sensitive to wavelengths of light in ranges that extend beyond the range of visible light, but that will be rendered in the visible spectrum during playback, which can produce an unnatural appearance in a photograph. To prevent this, most manufacturers of digital cameras provide an infrared filter in front of the optical sensor. According to an embodiment, an IR coating is applied to the transparent wafer 208 during the manufacturing process, or to the individual transparent plates 208 to eliminate a separate filter, and simplify the mechanism. Additional coatings can also be applied to the transparent wafer to further improve the quality of the captured images.

Processes for performing the manufacturing steps discussed above are very well known in the art, and are within the abilities of a person having ordinary skill in the art. Some are commonly referred to generally as thin-film processes—including the processes for depositing, patterning, and etching layers of the redistribution layer. Others are typically referred to generally as thick-film processes—including the methods practiced in depositing solder paste or sealing material in defined areas. Placement of the semiconductor material substrates on the transparent wafer can be done by a pick-and-place operation, which is commonly employed for wafer reconfiguration.

In addition to the advantages discussed above, there are a number of additional advantages afforded by various embodiments. The size of the substrate is reduced, for an equivalent sized sensor, which permits more devices per semiconductor wafer, thereby reducing the per unit cost. Backside light leakage is eliminated. Costs are reduced because processes employed are common in the industry, and relatively less expensive than the prior art processes, including the TSV process. Because the solder balls and the semiconductor material substrate are substantially encapsulated by the molding compound, they are physically and mechanically supported to a much greater degree than in the prior art device, so the sensor package is overall more robust and less prone to critical failure.

References in the specification or claims to the top or front of a semiconductor substrate refer to the active side of the substrate, i.e., the side on which active devices have been formed, without regard to its physical orientation or its orientation in the drawings. In particular, this is the side on which the optical sensor is positioned. The bottom or back of the substrate will therefore be understood as referring to the side of the substrate opposite the sensor. Likewise, with reference to the transparent wafer, the top or front is the face on which the redistribution layers are positioned. Reference to elements as being above or below other elements can be understood in this context as well. For example, a reference to one layer as being formed on top of a substrate above another layer can be understood as meaning that the one layer is positioned on the active side of the substrate with the other layer positioned between it and the surface of the substrate.

The term transparent can refer to any material of sufficient transparency in the required wavelengths of light to serve as the transparent substrate as described herein. Thus, depending on the transmission requirements of a particular use, the transparent plate can be any of a number of semiconductor materials, Pyrex® or other glass formulations, or suitable plastics. The transparent substrate may be transparent to a broad spectrum of wavelengths, or substantially opaque to all but a narrow band of wavelengths. Provided the substrate is sufficiently transparent to the wavelengths required for an intended application, it can be regarded as being transparent.

The optical sensor package is described, with reference to the embodiment of FIG. 3, as being mounted to a circuit board, which may also be referred to as a printed circuit board, a PCB, a printed wiring board, a PWB, etc. For the purposes of claim construction, the term circuit board includes any surface to which an optical sensor package is mounted, and to which contact points are attached by which the optical sensor package communicates or interfaces with associated circuits.

The abstract of the present disclosure is provided as a brief outline of some of the principles of the invention according to one embodiment, and is not intended as a complete or definitive description of any embodiment thereof, nor should it be relied upon to define terms used in the specification or claims. The abstract does not limit the scope of the claims.

The following U.S. patent applications, filed concurrently herewith, are directed to subject matter that is related to or has some technical overlap with the subject matter of the present disclosure: MULTI-STACKED SEMICONDUCTOR DICE SCALE PACKAGE STRUCTURE AND METHOD OF MANUFACTURING SAME, by Kim-Yong Goh, application Ser. No. 12/651,080; FLIP-CHIP FAN-OUT WAFER LEVEL PACKAGE FOR PACKAGE-ON-PACKAGE APPLICATIONS, AND METHOD OF MANUFACTURE, by Kim-Yong Goh and Jing-En Luan, application Ser. No. 12/651,365; RELIABLE LARGE FAN-OUT WAFER LEVEL PACKAGE AND METHOD OF MANUFACTURE, by Kim-Yong Goh and Jing-En Luan, application Ser. No. 12/651,362; and FAN-OUT WAFER LEVEL PACKAGE WITH POLYMERIC LAYER FOR HIGH RELIABILITY, by Kim-Yong Goh, application Ser. No. 12/651,295; each of which is incorporated herein by reference in its entirety.

Elements of the various embodiments described above can be combined, and further modifications can be made, to provide further embodiments without deviating from the spirit and scope of the invention. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification, but should be construed to include all possible embodiments along with the full scope of equivalents to which such claims are entitled. Accordingly, the claims are not limited by the disclosure.

The invention claimed is:

1. An optical sensor package, comprising:
 a transparent substrate having first and second surfaces;
 a conductive layer, including a plurality of conductive traces, positioned over a first surface of the transparent substrate;
 a semiconductor substrate having first and second surfaces, positioned with the first surface of the semiconductor substrate facing, parallel to, and spaced apart from the first surface of the transparent substrate, the semiconductor substrate including:
  an optical sensor positioned on the first surface of the semiconductor substrate, and
  a plurality of contact pads positioned on the first surface of the semiconductor substrate; and
 a plurality of solder joints, each located between and electrically coupling a first end of a respective one of the plurality of conductive traces to a respective one of the plurality of contact pads, and mechanically coupling the semiconductor substrate to the transparent substrate.

2. The package of claim 1, comprising a plurality solder balls positioned on the first surface of the transparent substrate in electrical contact with a second end of a respective one of the plurality of conductive traces.

3. The package of claim 2, comprising an encapsulating layer extending on the first surface of the transparent substrate and contacting lateral sides of the semiconductor substrate and mechanically supporting the semiconductor substrate on the transparent substrate, the encapsulating layer having a planar surface lying in a plane substantially parallel to the first surface of the transparent substrate, and partially encapsulating each of the plurality solder balls.

4. The package of claim 3 wherein an outer surface of each of the plurality of solder balls is exposed at the planar surface of the encapsulating layer.

5. The package of claim 1, comprising a sealing layer extending between the first surface of the semiconductor material substrate and the first surface of the transparent substrate, and around a perimeter of the optical sensor.

6. The package of claim 1, comprising an encapsulating layer extending on the first surface of the transparent substrate and contacting lateral sides of the semiconductor substrate, the encapsulating layer having a planar surface defining a plane that lies substantially parallel to the first surface of the transparent substrate.

7. The package of claim 6, comprising a plurality of electrically conductive elements, each in electrical contact with a second end of a respective one of the plurality of conductive traces and extending through the encapsulation layer, a surface of each of the electrically conductive elements lying in the plane defined by the planar surface of the encapsulating layer.

8. An optical sensor package, comprising:
 a transparent substrate having first and second surfaces;
 a conductive layer, including a plurality of conductive traces, positioned over a first surface of the transparent substrate;
 a semiconductor substrate having first and second surfaces, positioned with the first surface of the semiconductor substrate facing, parallel to, and spaced apart from the first surface of the transparent substrate, the semiconductor substrate including:
  an optical sensor positioned on the first surface of the semiconductor substrate, and
  a plurality of contact pads positioned on the first surface of the semiconductor substrate; and
 a plurality of solder joints, each electrically coupling a first end of a respective one of the plurality of conductive traces to a respective one of the plurality of contact pads, and mechanically coupling the semiconductor substrate to the transparent substrate; and
 a first dielectric layer located over the first surface of the transparent substrate and over the conductive layer, and having:
  a first plurality of apertures, each positioned over the first end of a respective one of the conductive traces and through which one of the plurality of solder joints electrically couples a first end of the respective one of the plurality of conductive traces to the respective one of the plurality of contact pads; and
  a second plurality of apertures, each positioned over a second end of a respective one of the conductive traces; and
 a window substantially corresponding in size to the optical sensor, positioned opposite the optical sensor to permit light that passes through the transparent substrate to strike the optical sensor.

9. The package of claim 8, comprising a second dielectric layer located over the first surface of the transparent substrate between the transparent substrate, on one side, and the conductive layer and the first dielectric layer on an opposite side, the second dielectric layer having a window corresponding in size and position to the window of the first dielectric layer.

10. A camera, comprising:
 an optical sensor package coupled to the camera and positioned to receive thereon an image via a lens of the camera, the optical sensor package including:
  a semiconductor substrate having an optical sensor positioned on a first surface thereof, positioned in the camera to receive the image on the optical sensor,
  a transparent substrate positioned over the first surface of the semiconductor substrate with a first surface of the transparent substrate facing the first surface of the semiconductor substrate, and positioned so that the image passes through the transparent substrate before being received on the optical sensor, the transparent substrate being larger than and extending beyond the semiconductor substrate in at least one dimension,
  a first plurality of electrical contacts positioned over a portion of the transparent substrate that extends beyond the semiconductor substrate, and a redistribution layer positioned between the first plurality of electrical contacts and the first surface of the transparent substrate, configured to redistribute signal paths from the semiconductor substrate to the plurality of electrical contacts.

11. The camera of claim 10, comprising a circuit board coupled to the camera, and to which the optical sensor package is coupled, the circuit board comprising a second plurality of electrical contacts electrically coupled to respective ones of the first plurality of electrical contacts.

12. The camera of claim 10 wherein the first plurality of electrical contacts is a plurality of solder balls.

13. The camera of claim 10, comprising a layer of molding compound positioned on the first surface of the transparent substrate, and wherein the semiconductor is substantially encapsulated in the layer of molding compound.

\* \* \* \* \*